(12) United States Patent
Kashiwagi et al.

(10) Patent No.: US 7,751,252 B2
(45) Date of Patent: Jul. 6, 2010

(54) SEMICONDUCTOR MEMORY WITH A REFERENCE CURRENT GENERATING CIRCUIT HAVING A REFERENCE CURRENT GENERATING SECTION AND AN AMPLIFIER SECTION

(75) Inventors: Jin Kashiwagi, Yokohama (JP);
Yasuhiko Honda, Hiratsuka (JP);
Yoshihiko Kamata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 38 days.

(21) Appl. No.: 12/273,979

(22) Filed: Nov. 19, 2008

(65) Prior Publication Data

US 2009/0129148 A1 May 21, 2009

(30) Foreign Application Priority Data

Nov. 20, 2007 (JP) ............................. 2007-300268

(51) Int. Cl.
*G11C 16/28* (2006.01)

(52) U.S. Cl. ................. 365/185.21; 365/185.2; 365/185.17; 365/185.25; 365/185.03

(58) Field of Classification Search ........... 365/185.03, 365/185.21, 185.2, 185.17, 185.22, 185.25
See application file for complete search history.

(56) References Cited

U.S. PATENT DOCUMENTS 7,466,610 B2 * 12/2008 Umezawa et al. ............ 365/200
2009/0129148 A1 * 5/2009 Kashiwagi et al. ........ 365/185.2

FOREIGN PATENT DOCUMENTS

JP 2004-103211 4/2004

* cited by examiner

*Primary Examiner*—Andrew Q Tran
(74) *Attorney, Agent, or Firm*—Oblon, Spivak, McClelland, Maier & Neustadt, L.L.P.

(57) ABSTRACT

A semiconductor memory capable of storing and reading data in a memory cell for holding the data corresponding to a threshold voltage has a reference current generating circuit having a reference current generating section and an amplifier section.

16 Claims, 7 Drawing Sheets

SEMICONDUCTOR MEMORY WITH A REFERENCE CURRENT GENERATING CIRCUIT HAVING A REFERENCE CURRENT GENERATING SECTION AND AN AMPLIFIER SECTION

CROSS-REFERENCE TO RELATED APPLICATION

This application is based upon and claims the benefit of priority from the prior Japanese Patent Application No. 2007-300268, filed on Nov. 20, 2007, the entire contents of which are incorporated herein by reference.

BACKGROUND OF THE INVENTION

1. Field of the Invention

The present invention relates to a semiconductor memory, for example, a nonvolatile semiconductor memory such as a NOR flash memory including a reference current generating circuit.

2. Background Art

A NOR flash memory of the prior art includes, for example, a reference current generating circuit for supplying a reference current to a sense amplifier (for example, see Japanese Patent Laid-Open No. 2004-103211). The reference current generating circuit includes, for example, a reference cell, a current mirror circuit connected to the reference cell, and an output section which is fed with a current obtained by current mirroring a current passing through the reference cell from the current mirror circuit.

In the reference current generating circuit, for example, the initial potential of the reference current is a ground potential at the output section. Then, the output section is charged by a MOS transistor making up the current mirror circuit.

An amount of charge required for charging is determined by a potential difference (the ground potential−a direct-current potential reached by the output section)×a parasitic capacitance. In this case, charging from the current mirror circuit is interrupted by the discharge of an output MOS transistor which makes up the output section and is diode-connected.

Thus, the closer to the direct-current potential reached by the output section, the longer the discharge time. In other words, in the prior art, the rate of rise of the reference current cannot be increased.

SUMMARY OF THE INVENTION

According to one aspect of the present invention, there is provided: a semiconductor memory capable of storing and reading data in a memory cell for holding the data corresponding to a threshold voltage, comprising a reference current generating circuit having a reference current generating section and an amplifier section, the reference current generating section comprising:

a first MOS transistor of first conductivity type which has one end connected to a power supply and is diode-connected;

a reference cell which is connected to an other end of the first MOS transistor and ground, has a word line fed with a predetermined voltage, and is configured as the memory cell;

a second MOS transistor of the first conductivity type which has one end connected to the power supply and is fed with a current obtained by current mirroring a current passing through the first MOS transistor; and a third MOS transistor of second conductivity type which is connected between an other end of the second MOS transistor and the ground and has a gate connected to the other end of the second MOS transistor, the amplifier section comprising:

a fourth MOS transistor of the first conductivity type which has one end connected to the power supply and is diode-connected;

a fifth MOS transistor of the second conductivity type which is connected between an other end of the fourth MOS transistor and the ground and has a gate connected to an output terminal;

a sixth MOS transistor of the first conductivity type which has one end connected to the power supply and is fed with a current obtained by current mirroring a current passing through the fourth MOS transistor;

a seventh MOS transistor of the second conductivity type which is connected between an other end of the sixth MOS transistor and the ground and has a gate connected to the gate of the third MOS transistor;

an eighth MOS transistor of the first conductivity type which has one end connected to the power supply and is fed with a current obtained by current mirroring the current passing through the fourth MOS transistor;

a ninth MOS transistor of the second conductivity type which is connected between an other end of the eighth MOS transistor and the ground and has a gate connected to the other end of the eighth MOS transistor;

a tenth MOS transistor of the first conductivity type which has one end connected to the power supply, an other end connected to the output terminal, and a gate connected to the other end of the sixth MOS transistor; and an eleventh MOS transistor of the second conductivity type which is connected between the other end of the tenth MOS transistor and the ground and has a gate connected to the other end of the eighth MOS transistor, the amplifier section outputting a reference current from the output terminal to a wire in response to an output of the reference current generating section.

DETAILED DESCRIPTION

The present invention is applied to, for example, a nonvolatile semiconductor memory such as a NOR flash memory in which data can be stored in and read from a memory cell for storing data corresponding to a threshold voltage. Thus it is possible to increase the rate of rise of a reference current used for, for example, reading in the memory cell of the NOR flash memory.

Embodiments to which the present invention is applied will be described below with reference to the accompanying drawings.

First Embodiment

Figure 1:
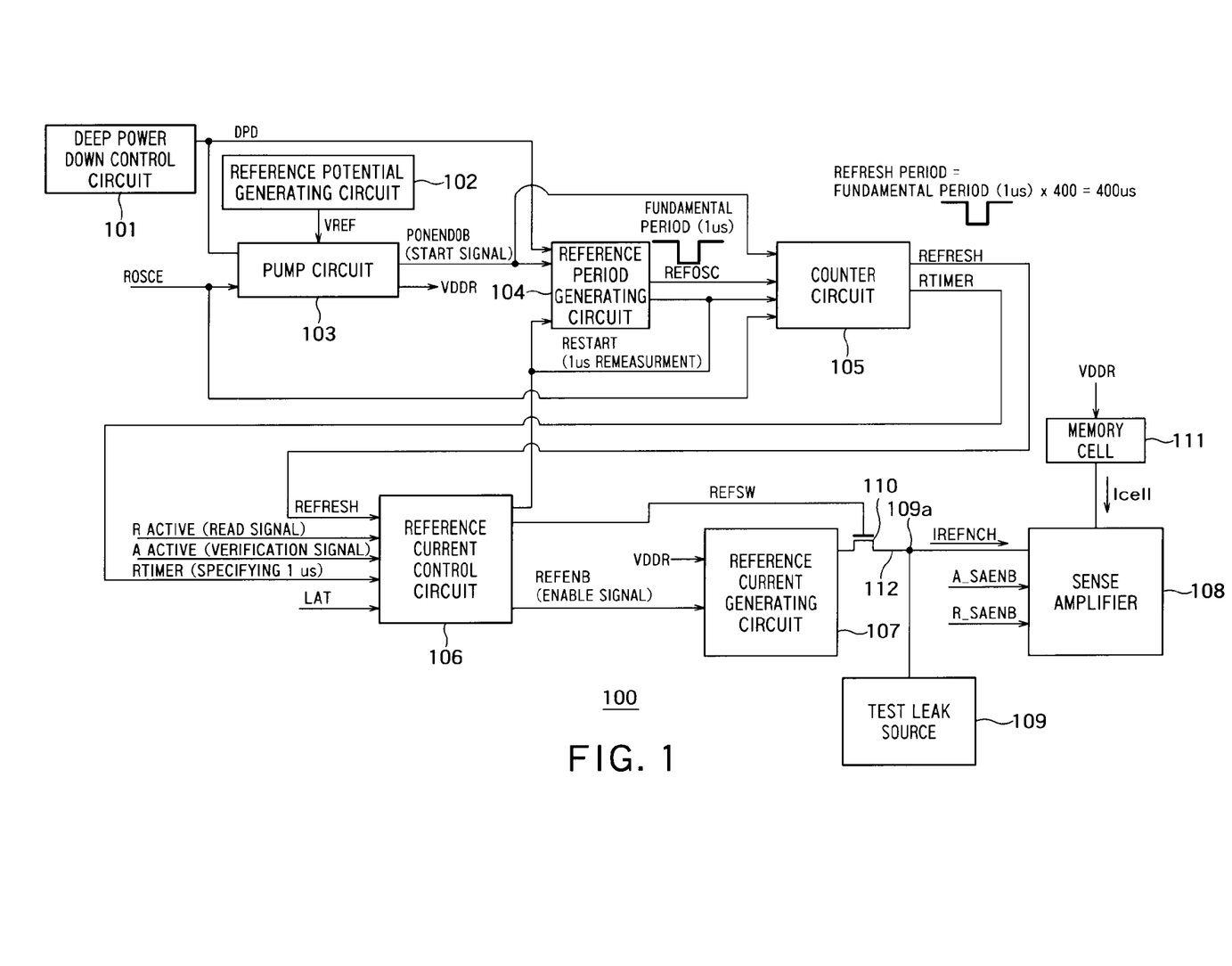
FIG. 1 illustrates a system configuration including the reference current generating circuit of a semiconductor memory according to a first embodiment which is an aspect of the present invention.

FIG. 1 illustrates a system configuration including the reference current generating circuit of a semiconductor memory according to a first embodiment which is an aspect of the present invention.

As shown in FIG. 1, a semiconductor memory 100 includes a deep power down control circuit 101, a reference potential generating circuit 102, a pump circuit 103, a reference period generating circuit 104, a counter circuit 105, a reference current control circuit 106, a reference current generating circuit 107, a sense amplifier 108, a test leak source 109, a switch circuit 110, and a memory cell 111.

The deep power down control circuit 101 outputs a deep power down signal DPD for deactivating the pump circuit 103 and the reference period generating circuit 104 to minimize current consumption. The semiconductor memory 100 of the present embodiment has two current saving modes of a deep power down state and a standby state. The deep power down state is defined as a state having smaller current consumption than in the standby state.

The pump circuit 103 boosts a power supply voltage in response to a signal ROSCE and outputs a potential VDDR to be supplied to a word line connected to the memory cell 111 and a word line connected to a reference cell. The pump circuit 103 boosts the potential VDDR to a desired set value based on a reference potential VREF outputted from the reference potential generating circuit 102. The pump circuit 103 is deactivated in response to the deep power down signal DPD.

The reference period generating circuit 104 outputs a pulse signal REFOSC having a fundamental period of, for example, 1 us, in response to a signal PONEND0B outputted from the pump circuit 103 and a signal RESTART outputted from the reference current control circuit 106. The reference period generating circuit 104 is deactivated in response to the deep power down signal DPD.

The counter circuit 105 counts the pulse signals REFOSC in response to the signal RESTART, and outputs a refresh pulse signal REFRESH for each refresh period (e.g., 400 us). The refresh pulse signal REFRESH is a signal for specifying a refresh state for recharging a wire 112 which is fed with a reference current distributed potential IREFNCH.

The counter circuit 105 outputs a signal RTIMER for specifying a predetermined time (in this case, e.g., 1 us), in response to the signal RESTART.

The reference current control circuit 106 outputs a signal REFSW and an enable signal REFENB in response to the refresh pulse signal REFRESH, a read signal R_ACTIVE for specifying a reading state, a verification signal A_ACTIVE for specifying a verifying state, the signal RTIMER, and a signal LAT for specifying a latching operation of the sense amplifier 108. The reference current control circuit 106 outputs the enable signal REFENB when entering a reading operation, a verifying operation, and a refreshing state during standby.

The reference current generating circuit 107 is activated in response to the enable signal REFENB and outputs the reference current distributed potential IREFNCH. The reference current generating circuit 107 is deactivated in synchronization with the deactivation of the reference period generating circuit 104 during deep power down and standby.

The sense amplifier 108 compares a cell current Icell passing through the memory cell 111 and a reference current Iref, and outputs the comparison result. Based on the comparison result, data stored in the memory cell 111 is read. The sense amplifier 108 is deactivated during deep power down and standby.

The switch circuit 110 is connected between the reference current generating circuit 107 and the wire 112 connected to the sense amplifier 108. The switch circuit 110 is controlled to be turned on/off in response to the signal REFSW, and can stop the supply of the reference current distributed potential IREFNCH from the reference current generating circuit 107 to the wire 112.

The memory cell 111 is made up of a nonvolatile transistor (for example, an EEPROM cell) for storing data corresponding to a threshold value. The memory cell 111 has a word line fed with the potential VDDR. When the potential VDDR is applied to the word line, the cell current Icell corresponding to the threshold voltage passes through the memory cell 111.

When the reference current generating circuit 107 is powered on, the wire 112 is temporarily charged and the switch circuit 110 is turned off. It is therefore possible to keep the potential of the wire 112 at a desired value. After that, when the reference current distributed potential IREFNCH is necessary in a reading operation, the potential of the wire 112 is kept to some extent, thereby eliminating the need for charging from the ground potential and increasing the rate of rise of the potential.

The potential of the wire 112 may be changed by a leakage current and the like when the switch circuit 110 is turned off. Thus the refreshing operation is necessary in each fixed period.

In the case of a multivalued memory cell, for example, four threshold value distributions are set for each memory cell. The spacing between the threshold value distributions tends to be smaller than in a binary memory cell. Since the spacing between the threshold value distributions is small in a multivalued memory cell, the reference current Iref has to be set more accurately than in a binary memory cell.

Further, in a reading operation, a difference between the reference current Iref and the cell current Icell of the memory cell is smaller than in a binary memory cell, so that it takes a long time to determine data. It is therefore necessary to quickly prepare the reference current IREFNCH to absorb an increased determination time.

The following will describe an example of the configuration of the reference current generating circuit 107 in the semiconductor memory 100 configured thus.

Figure 2:
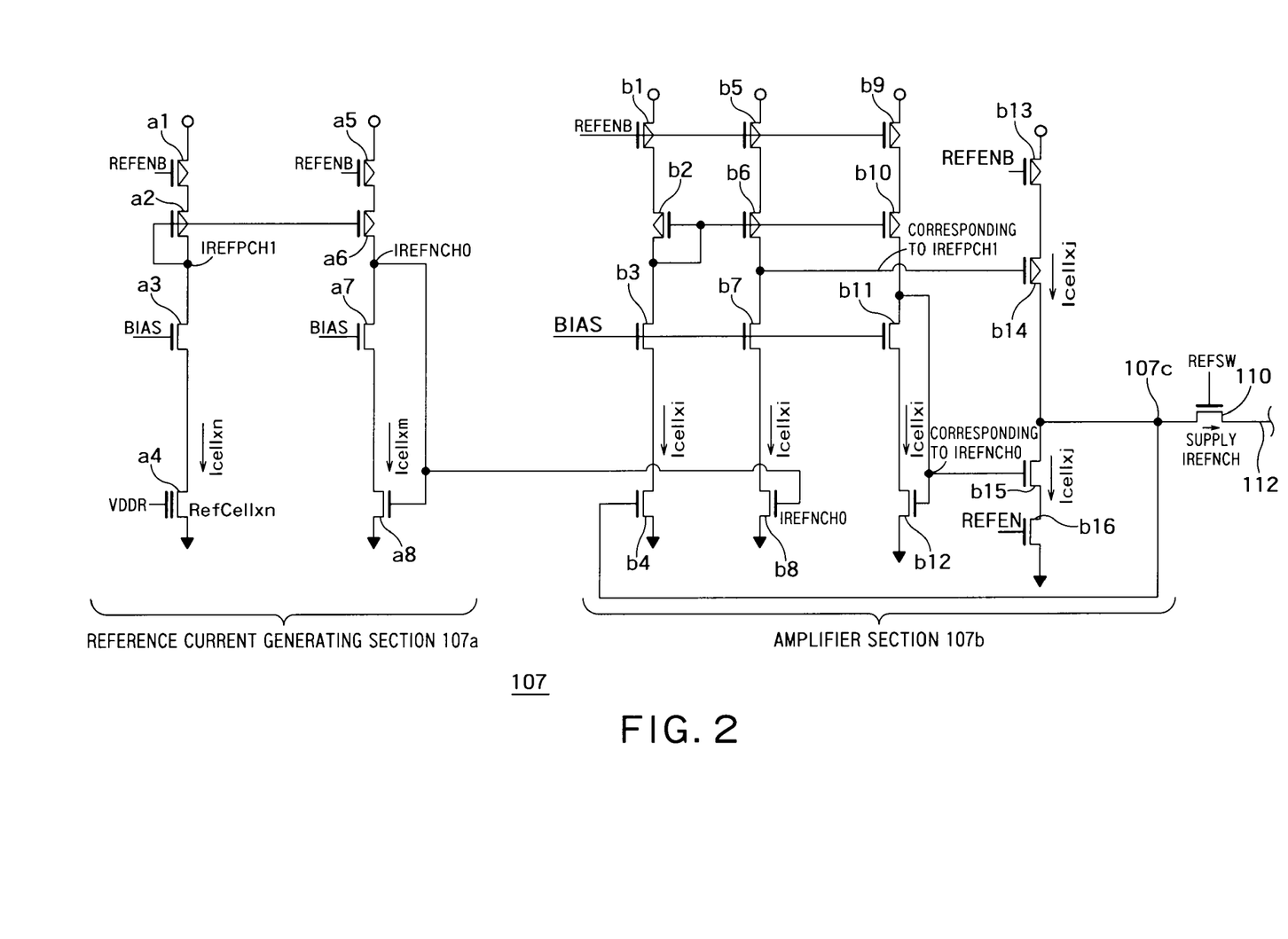
FIG. 2 is a circuit diagram showing the example of the configuration of the reference current generating circuit 107 in the semiconductor memory 100 of FIG. 1.

FIG. 2 is a circuit diagram showing the example of the configuration of the reference current generating circuit 107 in the semiconductor memory 100 of FIG. 1. In FIG. 2, a MOS transistor of a first conductivity type is a pMOS transistor and a MOS transistor of second conductivity type is an nMOS transistor. The polarities of the circuit may be changed with similar operations and thus a MOS transistor of first conductivity type may be an nMOS transistor and a MOS transistor of a second conductivity type may be a pMOS transistor.

As shown in FIG. 2, the reference current generating circuit 107 includes a reference current generating section 107a and an amplifier section 7b for outputting the reference current IREFNCH from an output terminal 107c to the wire 112 in response to the output of the reference current generating section.

The reference current generating section 107a includes pMOS transistors a1, a2, a5 and a6, nMOS transistors a3, a7 and a8, and a reference cell a4.

The pMOS transistor a1 has the gate fed with the enable signal REFENB and is controlled to be turned on/off in response to the enable signal REFENB.

The PMOS transistor a2 has one end (source) connected to a power supply via the pMOS transistor a1. The pMOS transistor a2 is diode-connected.

The nMOS transistor a3 has one end (drain) connected to the other end (drain) of the pMOS transistor a2. The threshold voltage of the nMOS transistor a3 is set around 0 V. A fixed voltage BIAS not lower than the threshold voltage is applied to the gate of the nMOS transistor a3.

The reference cell a4 is connected between the other end (source) of the nMOS transistor a3 and the ground. The potential VDDR is applied to the word line of the reference cell a4. The reference cell a4 is configured as the memory cell 111. The plurality of reference cells a4 may be connected in series so as to raise a cell current Icellxn at high speed.

The pMOS transistor a5 has the gate fed with the enable signal REFENB and is controlled to be turned on/off in response to the enable signal REFENB.

The pMOS transistor a6 has one end (source) connected to the power supply via the pMOS transistor a5 and the gate connected to the gate of the pMOS transistor a2. Thus the pMOS transistor a6 is fed with a current Icellxm obtained by current mirroring the current Icellxn passing through the pMOS transistor a2.

The nMOS transistor a7 has one end (drain) connected to the other end (drain) of the pMOS transistor a6. The threshold voltage of the nMOS transistor a7 is set around 0 V. The fixed voltage BIAS not lower than the threshold voltage is applied to the gate of the nMOS transistor a5.

The nMOS transistor a8 is connected between the other end (source) of the nMOS transistor a7 and the ground. The nMOS transistor a8 has the gate connected to the other end (drain) of the pMOS transistor a6.

As shown in FIG. 2, the amplifier section 107b includes pMOS transistors b1, b2, b5, b6, b9, b10, b13 and b14, nMOS transistors b3, b7, b11, b12, b15 and b16, and input MOS transistors b4 and b8.

The pMOS transistor b1 has the gate fed with the enable signal REFENB and is controlled to be turned on/off in response to the enable signal REFENB.

The pMOS transistor b2 has one end (source) connected to the power supply via the pMOS transistor b1. The pMOS transistor b2 is diode-connected.

The nMOS transistor b3 has one end (drain) connected to the other end (drain) of the pMOS transistor b2. The threshold voltage of the nMOS transistor b3 is set around 0 V. The fixed voltage BIAS not lower than the threshold voltage is applied to the gate of the nMOS transistor b3.

The input MOS transistor b4 is connected between the other end (source) of the nMOS transistor b3 and the ground. The gate of the input MOS transistor b4 is connected to the output terminal 107c. In other words, the gate of the input MOS transistor b4 acts as the non-inverting input terminal of the amplifier section 107b.

The pMOS transistor b5 has the gate fed with the enable signal REFENB and is controlled to be turned on/off in response to the enable signal REFENB.

The pMOS transistor b6 has one end (source) connected to the power supply via the PMOS transistor b5 and the gate connected to the gate of the pMOS transistor b2. Thus the pMOS transistor b6 is fed with a current Icellxi obtained by current mirroring a current Icellxi passing through the pMOS transistor b2.

The nMOS transistor b7 has one end (drain) connected to the other end (drain) of the pMOS transistor b6. The threshold voltage of the nMOS transistor b7 is set around 0 V. The fixed voltage BIAS not lower than the threshold voltage is applied to the gate of the nMOS transistor b7.

The input MOS transistor b8 is connected between the other end (source) of the nMOS transistor b7 and the ground. The gate of the input MOS transistor b8 is connected to the gate of the nMOS transistor a8. In other words, the gate of the input MOS transistor b8 acts as the inverting input terminal of the amplifier section 107b.

The pMOS transistor b9 has the gate fed with the enable signal REFENB and is controlled to be turned on/off in response to the enable signal REFENB.

The pMOS transistor b10 has one end (source) connected to the power supply via the pMOS transistor b9 and the gate connected to the gate of the pMOS transistor b2. Thus the pMOS transistor b10 is fed with the current Icellxi obtained by current mirroring the current Icellxi passing through the pMOS transistor b2.

The nMOS transistor b11 has one end (drain) connected to the other end (drain) of the pMOS transistor b10. The threshold voltage of the nMOS transistor b11 is set around 0 V. The fixed voltage BIAS not lower than the threshold voltage is applied to the gate of the nMOS transistor b11.

The nMOS transistor b12 is connected between the other end (source) of the nMOS transistor b11 and the ground. The nMOS transistor b12 has the gate connected to the other end (drain) of the pMOS transistor b10.

The pMOS transistor b13 has the gate fed with the enable signal REFENB and is controlled to be turned on/off in response to the enable signal REFENB.

The pMOS transistor b14 has one end (source) connected to the power supply via the pMOS transistor b13 and the gate connected to the other end (drain) of the pMOS transistor b6. With this configuration, a gate voltage inputted to the pMOS transistor b14 is at the same potential as the gate voltage of the pMOS transistor a2, and the pMOS transistor b14 is fed with a current Icellxj equal to the current Icellxn passing through the pMOS transistor a2.

The other end (drain) of the pMOS transistor b14 is connected to the output terminal 107c. The pMOS transistor b14 has a larger size than the other pMOS transistors a2, a6, b2, b6 and b10.

The nMOS transistor b16 has the gate fed with a signal REFEN which is the inverted signal of the enable signal REFENB, and is controlled to be turned on/off in response to the signal REFEN.

The nMOS transistor b15 has one end (drain) connected to the other end (drain) of the pMOS transistor b14. The nMOS transistor b15 has the other end (source) connected to the ground via the nMOS transistor b16.

The nMOS transistor b15 has the gate connected to the gate of the nMOS transistor b12. Thus the nMOS transistor b15 is fed with the current Icellxj obtained by current mirroring the current Icellxi passing through the nMOS transistor b12. The other end (drain) of the nMOS transistor b15 is connected to the output terminal 107c. The nMOS transistor b15 has a larger size than the other nMOS transistors a8, b4, b8 and b12.

In the reference current generating circuit 107 configured thus, for example, the pMOS transistor a1, a5, b1, b5 and b9 are set to have the same size. Further, for example, the pMOS transistors a2, a6, b2, b6 and b10 are set to have the same size. Moreover, for example, the nMOS transistors a3, a7, b3, b7 and b11 are set to have the same size. Further, for example, the nMOS transistors a8, b4, b8 and b12 are set to have the same size.

In this case, the other end (drain) of the pMOS transistor b6 is set at the same potential as a potential IREFPCH1 of the other end (drain) of the PMOS transistor a2 by current mirroring. Further, the other end (drain) of the pMOS transistor b10 is set at the same potential as the potential IREFPCH1 of the other end (drain) of the PMOS transistor a6 by current mirroring.

The amplifier section 107b configured thus feeds back a potential to be inputted to the input MOS transistor b4 from the output terminal 107c such that the potential is equal to a potential IREFNCH0.

The amplifier section 107b controls the potential of the output terminal 107c by charging the output terminal 107c from the PMOS transistor b14 and discharging the output terminal 107c from the nMOS transistor b15.

For example, in the case of an overshoot of an output signal (the potential of the output terminal 107c) from a target, the capability of the nMOS transistor b16 is increased and then a current is drawn. On the other hand, in the case of an undershoot of the output signal (the potential of the output terminal 107c) from a target, the capability of the pMOS transistor b14 is increased and then a current is passed.

Thus high-speed control can be achieved as compared with the prior art in which a fixed current is drawn by a current mirror scheme.

As described above, the pMOS transistor b14 and the nMOS transistor b15 are larger in size than the other MOS transistors with faster operations.

Thus the potential of the output terminal 107c (wire 112) can rise faster than in the current mirror scheme of the prior art.

As described above, the semiconductor memory of the present embodiment can increase the rate of rise of the reference current. Particularly, since the reference current can quickly rise, the reading operation can be performed faster in the foregoing multivalued memory cell.

Second Embodiment

The first Embodiment described an example of the configuration for increasing the rate of rise of the reference current. The present embodiment will particularly describe another example of the configuration of the reference current generating circuit for increasing the rate of rise of the reference current.

Figure 3:
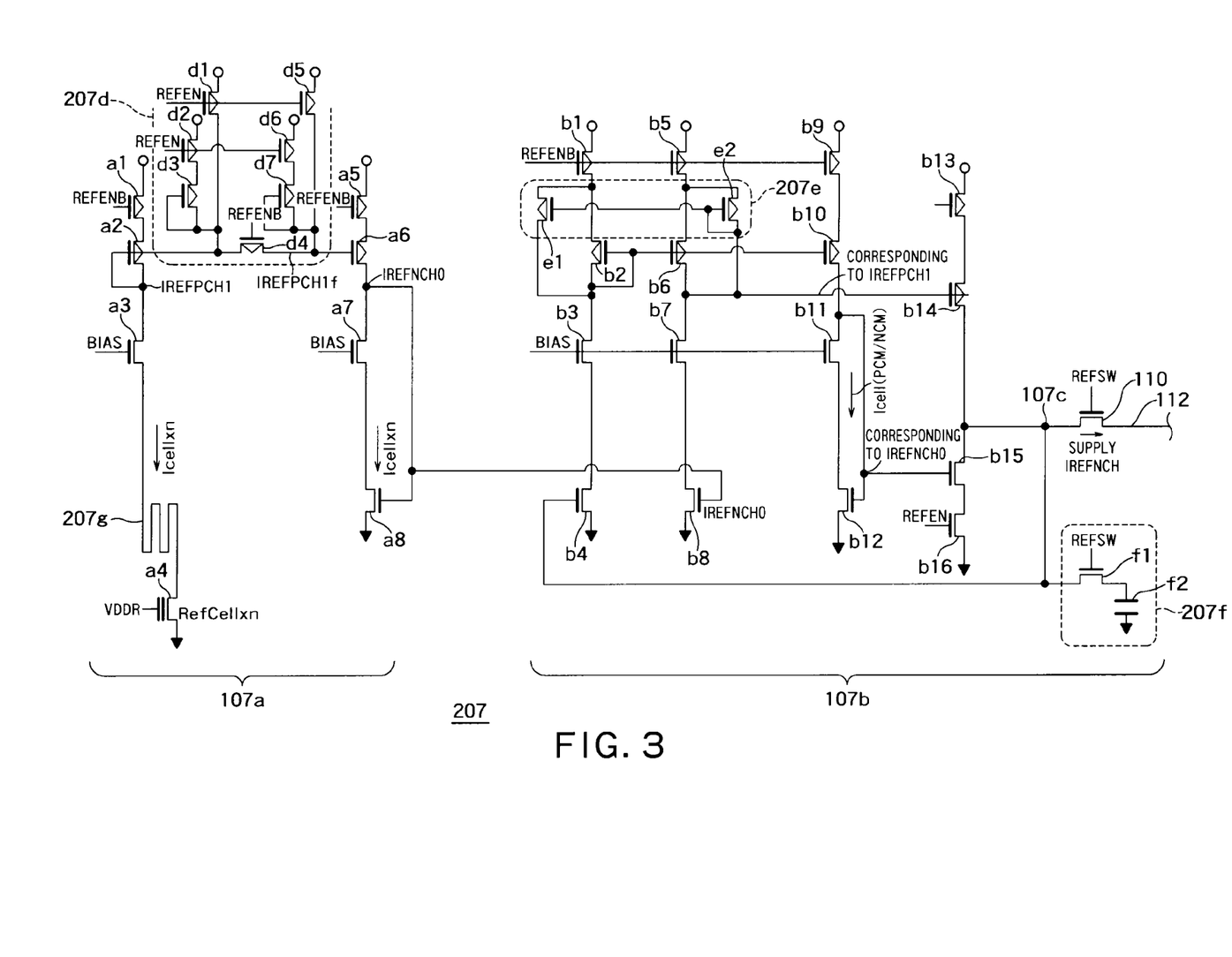
FIG. 3 shows another example of the configuration including the reference current generating circuit 107 of the semiconductor memory 100 shown in FIG. 1.

FIG. 3 shows another example of the configuration including the reference current generating circuit 107 of the semiconductor memory 100 shown in FIG. 1. Configurations indicated by the same reference numerals as the first embodiment are the same configurations as the first embodiment. A reference current generating circuit 207 of FIG. 3 is applied to the semiconductor memory 100 of FIG. 1 as the reference current generating circuit 107 of the first embodiment.

As shown in FIG. 3, unlike the reference current generating circuit 107 of the first embodiment, the reference current generating circuit 207 further includes a potential holding circuit 207d, a first oscillation preventing circuit 207e, a second oscillation preventing circuit 207f, and a bit line resistor 207g. Other configurations are the same as in the reference current generating circuit 107 of the first embodiment.

The potential holding circuit 207d includes pMOS transistors d1, d2, d4, d5, d6 and d7.

The pMOS transistor d1 is connected between a power supply and the gate of a pMOS transistor a2. The pMOS transistor d1 has the gate fed with a signal REFEN, which is the inverted signal of an enable signal REFENB, and is controlled to be turned on/off in response to the signal REFEN.

The pMOS transistor d2 has one end (source) connected to the power supply and the other end (drain) connected to the gate of the pMOS transistor a2 via the diode-connected pMOS transistor d3.

The pMOS transistor d5 is connected between the power supply and the gate of a pMOS transistor a6. The pMOS transistor d5 has the gate fed with the signal REFEN, which is the inverted signal of the enable signal REFENB, and is controlled to be turned on/off in response to the signal REFEN.

The pMOS transistor d6 has one end (source) connected to the power supply and the other end (drain) connected to the gate of the pMOS transistor a6 via the diode-connected pMOS transistor d7.

The pMOS transistor d4 is connected between the gate of the pMOS transistor a2 and the gate of the pMOS transistor a6. The pMOS transistor d4 has the gate fed with the enable signal REEENB and is controlled to be turned on/off in response to the enable signal REEENB.

The potential holding circuit 207d configured thus boosts a potential to a predetermined potential (in this case, the threshold voltage of a power supply voltage VDD-pMOS transistor) when the reference current generating circuit 207 is deactivated. Thus a reference current generating section 107a can be powered up more quickly.

As shown in FIG. 3, the first oscillation preventing circuit 207e includes pMOS transistors e1 and e2.

The pMOS transistor e1 is connected in parallel with the pMOS transistor b2 between the pMOS transistor be and the nMOS transistor b3.

The pMOS transistor e2 is connected in parallel with the pMOS transistor b6 between the pMOS transistor b5 and the nMOS transistor b7. The pMOS transistor e2 has the gate connected to the gate of the pMOS transistor e1 and is diode-connected.

In this way, the first oscillation preventing circuit 207e is configured such that the current mirror circuit of the pMOS transistors e1 and e2 is connected in the opposite direction from the current mirror circuit of the pMOS transistors b2 and b6.

With this configuration, the gate input signal of the PMOS transistor b14 can be set high, which generates a dead zone on the side of the pMOS transistor b14 and the side of the nMOS transistor b15. Thus it is possible to suppress the oscillation of an output signal (a reference current distributed potential IREFNCH).

As shown in FIG. 3, the second oscillation preventing circuit 207f includes a switch circuit f1 having one end connected to an output terminal 107c and a capacitive element f2 connected between the other end of the switch circuit f1 and the ground.

The switch circuit f1 has the gate fed with the enable signal REFENB and is controlled to be turned on when a switch circuit 110 is turned on. Thus a wire 112 and the capacitive element f2 are electrically connected to each other and the oscillation of the reference current distributed potential IREFNCH is suppressed.

As shown in FIG. 3, the bit line resistor 207g is connected between an nMOS transistor a3 and a reference cell a4. The bit line resistor 207g is a metal wire which has the same width and length as a local bit line connected to a memory cell 111. Thus it is possible to increase the equivalence of a capacitance and generate a reference current Iref with higher accuracy.

As described above, the semiconductor memory of the present embodiment can increase the rate of rise of the reference current.

Third Embodiment

The first and second embodiments described examples of the configuration for increasing the rate of rise of the reference current. The present embodiment will particularly describe an example of control on a reading operation, a verifying operation, and a refreshing operation for increasing the rate of rise of the reference current.

Figure 4A:
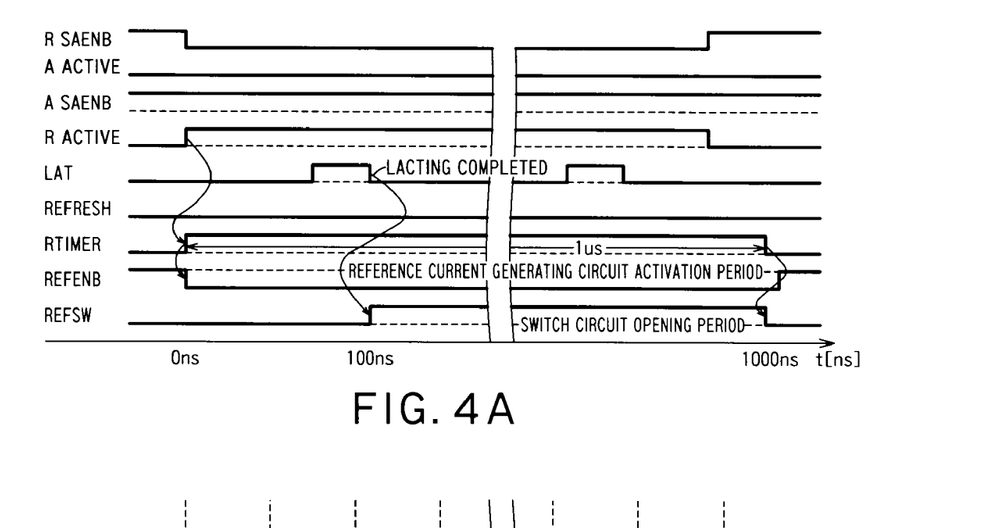
FIG. 4A is a timing chart showing an example of signals during the reading operation of a semiconductor memory 100 shown in FIG. 1.

FIG. 4A is a timing chart showing an example of signals during the reading operation of a semiconductor memory 100 shown in FIG. 1. As shown in FIG. 4A, a read signal R_ACTIVE becomes "High" and the semiconductor memory 100 is placed in a reading state. In a period during which a signal R_SAENB is "Low", a sense amplifier 108 is activated.

A reference current control circuit 106 outputs a signal RESTART in synchronization with a change of the read signal R_ACTIVE. In response to the signal RESTART, a counter circuit 105 changes a signal RTIMER to "High". The signal RTIMER is kept at "High" for a predetermined time (e.g., 1 us) and then is changed to "Low".

In synchronization with the change of the signal RTIMER to "High", a reference current control circuit 106 changes an enable signal REFENB to "Low". Thus a reference current generating circuit 107 is activated.

Next, at the completion of latching of data having been determined by a sense amplifier 108, a signal LAT changes to "Low". In synchronization with the change of the signal LAT, the reference current control circuit 106 changes a signal REFSW to "High" and turns on a switch circuit 110, so that a wire 112 is charged.

After the read signal R_ACTIVE becomes "Low" (at the completion of the reading operation), the counter circuit 105 changes the signal RTIMER to "Low". The reference current control circuit 106 changes the signal REFSW to "Low" in synchronization with the change of the signal RTIMER, so that the switch circuit 110 is turned off.

After that, the reference current control circuit 106 changes the enable signal REFENB to "High" and deactivates the reference current generating circuit 107.

In other words, the reference current control circuit 106 activates the reference current generating circuit 107 in response to the read signal R_ACTIVE, and does not open the switch circuit 110 before receiving the signal LAT. The switch circuit 110 is operated after the reading operation (after the completion of latching), so that the propagation of noise can be suppressed.

Thus in the first reading operation after recovery from a standby state, the reference current generating circuit 107 is not connected to the sense amplifier 108 (the switch circuit 110 is turned off) and the reading operation is performed with a charge held on the wire 112.

In this case, the activation period of the reference current generating circuit 107 is 1 us, which sufficiently recovers the potential of the wire 112 to a predetermined potential.

Figure 4B:
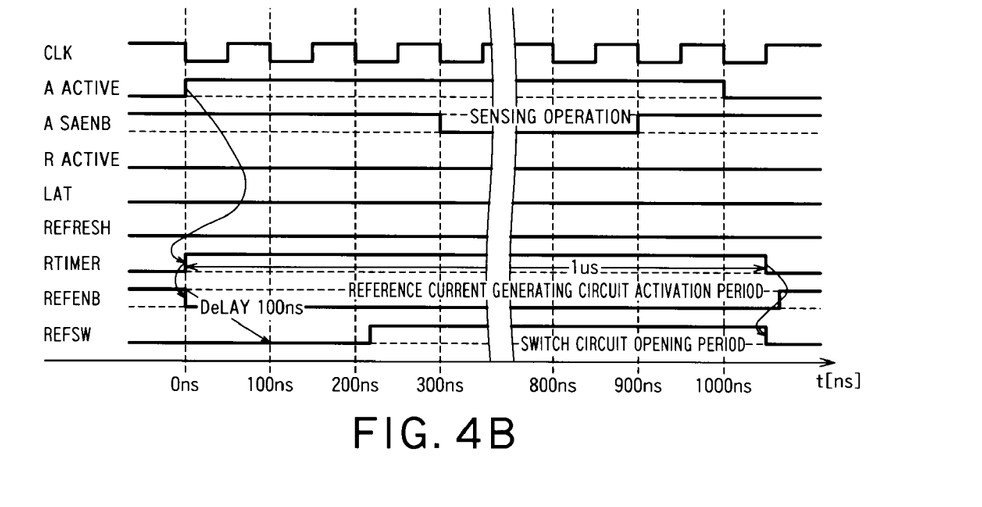
FIG. 4B is a timing chart showing an example of the signals during the verifying operation of the semiconductor memory 100 shown in FIG. 1.

FIG. 4B is a timing chart showing an example of the signals during the verifying operation of the semiconductor memory 100 shown in FIG. 1.

As shown in FIG. 4B, a verification signal A_ACTIVE becomes "High" and the semiconductor memory 100 is placed in a verified state.

In synchronization with the change of the verification signal A_ACTIVE, the reference current control circuit 106 outputs the signal RESTART. In response to the signal RESTART, the counter circuit 105 changes the signal RTIMER to "High".

In synchronization with the change of the signal RTIMER, the reference current control circuit 106 changes the enable signal REFENB to "Low", so that the reference current generating circuit 107 is activated.

After a predetermined delay (e.g., 100 ns) from when the enable signal REFENB changes to "Low" to when the reference current generating circuit 107 is powered up, the reference current control circuit 106 changes the signal REFSW to "High" and turns on the switch circuit 110, so that the wire 112 is charged.

After that (in this case, three clocks after the verification signal A_ACTIVE changes to "High"), a signal A_SAENB changes to "Low" and the sense amplifier 108 performs a sensing operation. When the signal A_SAENB changes to "High", the sensing operation of the sense amplifier 108 is completed.

After that, the verification signal A_ACTIVE becomes "Low" and the verifying operation of the semiconductor memory 100 is completed.

The counter circuit 105 changes the signal RTIMER to "Low" thereafter. The reference current control circuit 106 changes the signal REFSW to "Low" in synchronization with the change of the signal RTIMER, so that the switch circuit 110 is turned off.

The reference current control circuit 106 changes the enable signal REFENB to "High" and deactivates the reference current generating circuit 107.

In other words, the reference current control circuit 106 activates the reference current generating circuit thereafter in response to the verification signal A_ACTIVE indicating a verified state, and opens the switch circuit 110 after a lapse of 100 ns. After that, the sense amplifier is activated three clocks later after the verification signal A_ACTIVE changes to "High".

Thus it is possible to prevent noise caused by the opening of the switch circuit 110 from affecting the verifying operation.

Also in this example, the activation period of the reference current generating circuit 107 is 1 us, which sufficiently recovers the potential of the wire 112 to the predetermined potential.

Figure 4C:
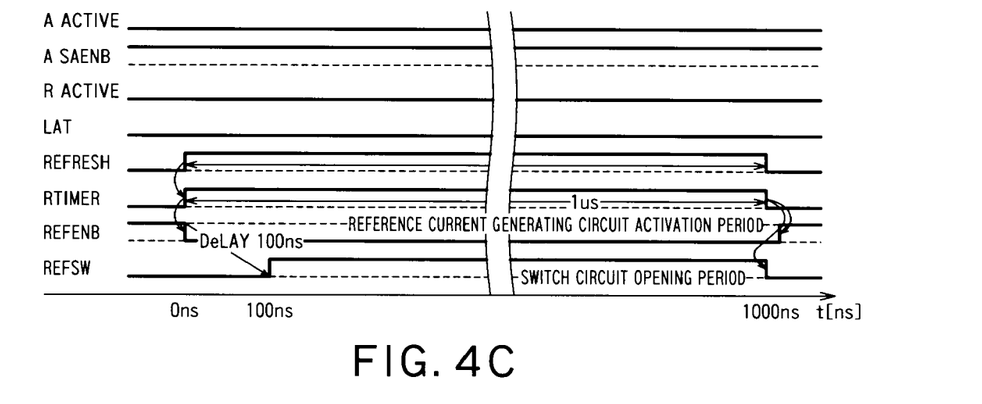
FIG. 4C is a timing chart showing an example of the signals during the refreshing operation of the semiconductor memory 100 shown in FIG. 1.

FIG. 4C is a timing chart showing an example of the signals during the refreshing operation of the semiconductor memory 100 shown in FIG. 1.

As shown in FIG. 4C, first, a refresh pulse signal REFRESH becomes "High" and the refreshing operation is started.

The reference current control circuit 106 outputs the signal RESTART in synchronization with the change of the refresh pulse signal REFRESH. The counter circuit 105 changes the signal RTIMER to "High" in response to the signal RESTART.

In synchronization with the change of the signal RTIMER, the reference current control circuit 106 changes the enable signal REFENB to "Low", so that the reference current generating circuit 107 is activated.

After a delay of 100 ns, the reference current control circuit 106 changes the signal REFSW to "High" and turns on the switch circuit 110, so that the wire 112 is charged.

After that (1 us after the signal RTIMER changes to "High"), the counter circuit 105 changes the signal RTIMER and the refresh pulse signal REFRESH to "Low". The reference current control circuit 106 changes the signal REFSW to "Low" in synchronization with the change of the signal RTIMER, so that switch circuit 110 is turned off.

After that, the reference current control circuit 106 changes the enable signal REFENB to "High" and deactivates the reference current generating circuit 107.

In other words, the reference current control circuit 106 activates the reference current generating circuit in response to the refresh pulse signal REFRESH, and opens the switch circuit 110 after a lapse of 100 ns.

Also in this example, the activation period of the reference current generating circuit 107 is 1 us, which sufficiently recovers the potential of the wire 112 to the predetermined potential.

As described above, the semiconductor memory of the present embodiment can increase the rate of rise of the reference current while reducing the influence of noise on the reference current.

Fourth Embodiment

As described above, the first and second embodiments described examples of the configuration for increasing the rate of rise of the reference current. In order to quickly respond to a reading operation immediately after power is turned on, a reference current distributed potential IREFNCH has to reach a desired level before the reading operation.

The present embodiment will describe an example in which the rise of a reference current is controlled after power is turned on. The following will particularly describe an example in which the reference current distributed potential IREFNCH is caused to reach a desired level in a power-on time (e.g., 500 us) after being boosted to the set value of the voltage VDDR.

Figure 5:
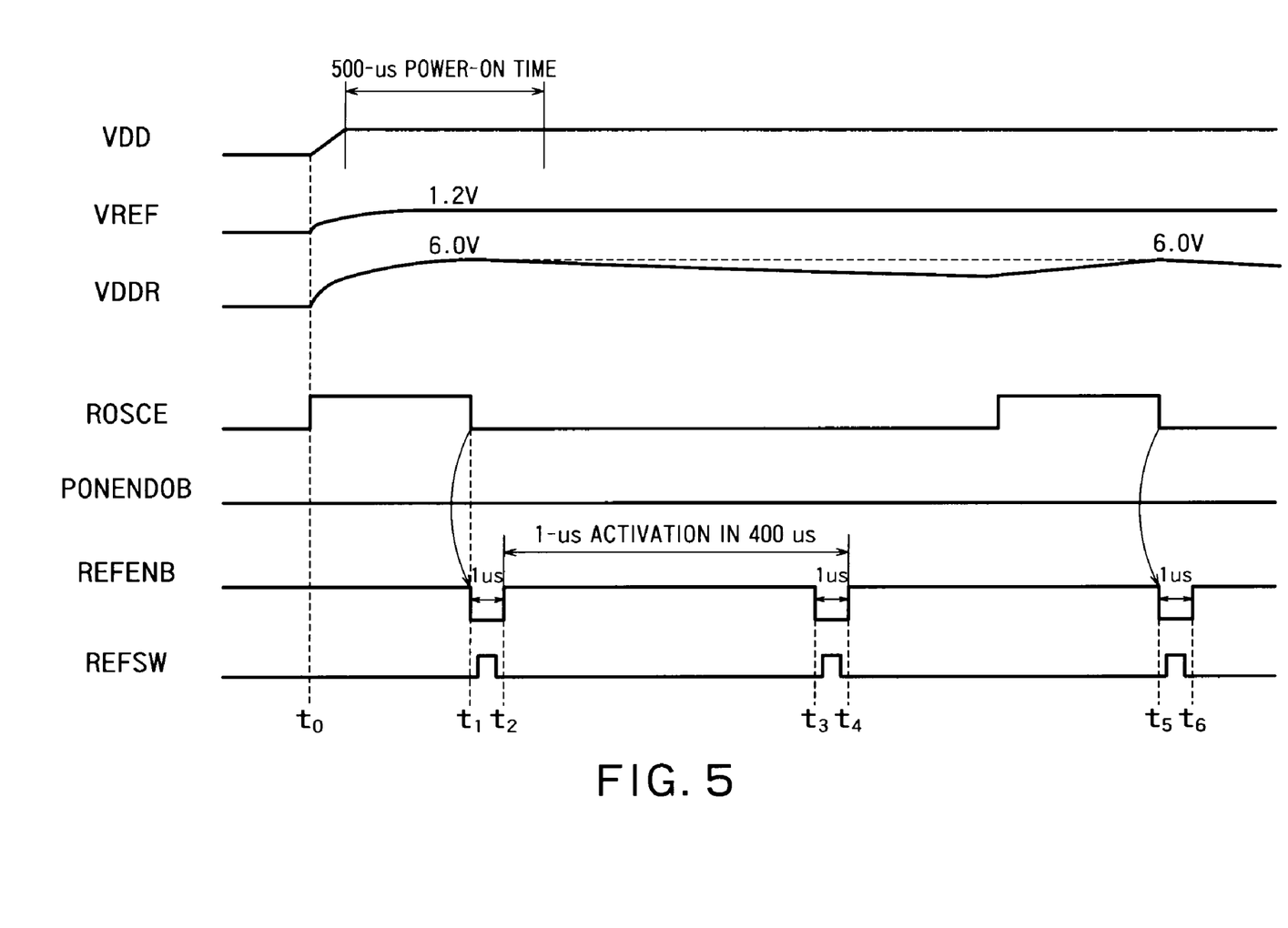
FIG. 5 is a timing chart showing an example of signals at the start of a semiconductor memory 100 shown in FIG. 1.

FIG. 5 is a timing chart showing an example of signals at the start of a semiconductor memory 100 shown in FIG. 1. As shown in FIG. 5, first, the power is turned on and a power supply voltage VDD rises (time t0). A reference voltage VREF outputted from a reference potential generating circuit 102 increases with the power supply voltage VDD.

A signal ROSCE becomes "High" at that time, so that a pump circuit 103 starts a boosting operation. When the potential VDDR reaches a set value (e.g., 6.0 V), the signal ROSCE becomes "Low", so that the boosting operation of the pump circuit 103 is stopped (time t1). Thus the potential VDDR decreases with the passage of time.

When the signal ROSCE becomes "Low", a counter circuit 105 outputs a refresh pulse signal REFRESH and a signal RTIMER in response to a signal PONED0B outputted from the pump circuit 103. As a result, a reference current control circuit 106 changes an enable signal REFENB to "Low" in response to these signals. Thus a reference current generating circuit 107 is activated.

After that, the reference current control circuit 106 changes a signal REFSW to "High" and turns on a switch circuit 110, so that a wire 112 is charged.

The reference current control circuit 106 changes the signal REFSW to "Low" thereafter, so that the switch circuit 110 is turned off.

After that, the reference current control circuit 106 changes the enable signal REFENB to "High" and deactivates the reference current generating circuit 107 (time t2).

The above operations allow the reference current distributed potential IREFNCH to reach the desired level in a power-on time (e.g., 500 us) after being boosted to the set value of the voltage VDDR.

After that, in order to recharge (refresh) the wire 112, the reference current generating circuit 107 is activated, for example, every 400 us (times t3 to t4).

After that, also at the completion of the second boosting operation of the pump circuit 103, the reference current control circuit 106 is activated (times t5 to t6).

Thus the wire 112 can be recharged (refreshed) in a state in which the predetermined voltage VDDR is applied to a reference cell a4. In other words, the wire 112 can be kept at a predetermined potential.

In this way, the wire 112 for distributing the reference current distributed potential IREFNCH to a sense amplifier is previously charged immediately after the semiconductor memory 100 is turned on. Thus the reference current distributed potential IREFNCH has been prepared at the start of a reading operation.

It is therefore possible to eliminate the need for a time period during which the reference current distributed potential IREFNCH is raised and prepared from the start the reading operation. Thus the reading operation can be performed faster.

Also in this example, the activation period of the reference current generating circuit 107 is 1 us, which sufficiently recovers the potential of the wire 112 to the predetermined potential.

As in the third embodiment, in the first reading operation after the semiconductor memory 100 is turned on, the reference current generating circuit 107 is not connected to a sense amplifier 108 (the switch circuit 110 is turned off) and the reading operation is performed with a charge held on the wire 112.

As described above, the semiconductor memory of the present embodiment can increase the rate of rise of the reference current while reducing the influence of noise on the reference current. Particularly, the reading operation of the semiconductor memory can be performed faster.

Fifth Embodiment

As described above, the first and second embodiments described examples of the configuration for increasing the rate of rise of the reference current. The present embodiment will particularly describe an example of control on a reading operation, a verifying operation, and a refreshing operation for increasing the rate of rise of a reference current.

Figure 6:
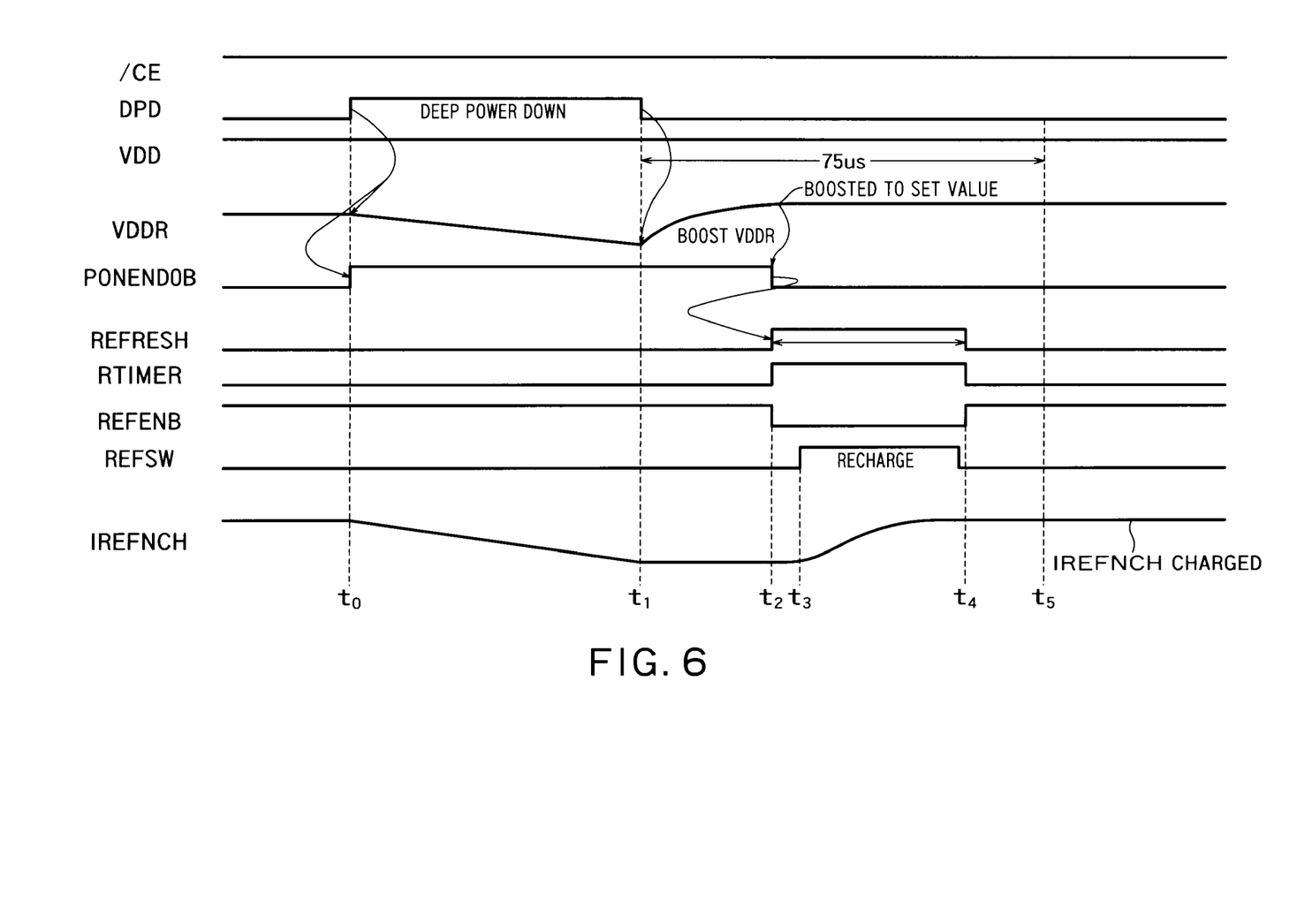
FIG. 6 is a timing chart showing an example of signals when a semiconductor memory of FIG. 1 is placed into a deep power down state and then recovers from the state.

FIG. 6 is a timing chart showing an example of signals when a semiconductor memory of FIG. 1 is placed into a deep power down state and then recovers from the state.

As shown in FIG. 6, first, a deep power down signal DPD changes to "High" and a semiconductor memory 100 is placed into the deep power down state (time t0).

At this point, since a pump circuit 103 is deactivated, a voltage VDDR drops. Further, the pump circuit 103 changes a signal PONEND0B to "High", so that a reference period generating circuit 104 and a counter circuit 105 are stopped.

Moreover, a reference current control circuit 106 changes an enable signal REFENB to "High" based on the change of the deep power down signal DPD. Thus the reference current control circuit 106 is also deactivated.

The potential of a wire 112 keep decreasing because of discharge such as leakage current (times t0 to t1).

Next, the deep power down signal DPD changes to "Low" and the semiconductor memory 100 recovers from the deep power down state (time t1). At this point, since the pump circuit 103 is activated, a boosting operation is started and the potential VDDR increases.

After that, when the voltage VDDR is boosted to a set value, the pump circuit 103 stops the boosting operation of the potential VDDR and changes the signal PONEND0B to "Low" (time t2). In response to the signal PONEND0B, the reference period generating circuit 104 and the counter circuit 105 are powered up. Then, the counter circuit 105 outputs a refresh pulse signal REFRESH and changes a signal RTIMER to "High".

In response to the refresh pulse signal REFRESH and the signal RTIMER, the reference current control circuit 106 changes the enable signal REFENB to "Low", so that a reference current generating circuit 107 is activated.

Next, the reference current control circuit 106 changes a signal REFSW to "High" to turn on a switch circuit 110 after a predetermined delay (e.g., 100 ns), so that the wire 112 is recharged.

After that, the reference current control circuit 106 changes the signal REFSW to "Low", so that the switch circuit 110 is turned off.

In response to the changes of the refresh pulse signal REFRESH and the signal RTIMER, the reference current control circuit 106 changes the enable signal REFENB to "High" and deactivates the reference current generating circuit 107 (time t4).

As described above, the semiconductor memory recovers from the deep power down state and the pump circuit 103 starts boosting the voltage VDDR. Before a lapse of a predetermined time (times t1 to t5, e.g., 75 us) after the start of the boosting operation, the wire 112 can be recharged (refreshed) with the boosted voltage VDDR.

In other words, after the recovery from the deep power down state, the wire 112 can be kept at a predetermined potential in a state in which the predetermined voltage VDDR is applied to a reference cell.

In this way, the wire 112 for distributing a reference current IREFNCH to a sense amplifier is charged beforehand after the semiconductor memory 100 recovers from the deep power down state. Thus the reference current distributed potential IREFNCH has been prepared at the start of a reading operation, which eliminates the need for a time period for starting and preparing the reference current distributed potential IREFNCH from the start of the reading operation. Thus the reading operation can be performed more quickly.

Also in this example, the activation period of the reference current generating circuit 107 is 1 us, which sufficiently recovers the potential of the wire 112 to the predetermined potential.

As described above, the semiconductor memory of the present embodiment can increase the rate of rise of the reference current while reducing the influence of noise on the reference current. Particularly, the reading operation of the semiconductor memory can be performed more quickly.

Sixth Embodiment

As shown in FIG. 1, a wire 112 fed with a reference current distributed potential IREFNCH is separated from a reference current generating circuit 107 by a switch circuit 110. In the event of a defect on an element composing the switch circuit 110, leakage current reduces the potential of the wire 112 and may cause problems in a reading operation and a verifying operation.

As described above, the wire 112 is recharged (refreshed) by activating the reference current generating circuit 107, for example, every 400 us. For example, a reading operation may be performed to conduct a test slightly before the recharge. However, it takes quite a long time to conduct a test on a memory cell 111 in a semiconductor memory 100.

The present embodiment will describe an example of a configuration for checking the presence or absence of leakage current, which is caused by the switch circuit on the wire, in a shorter time.

As shown in FIG. 1, the semiconductor memory 100 includes the test leak source 109. The test leak source 109 is connected to a contact 109a between the switch circuit 110 and a sense amplifier 108.

The wire 112 is deliberately discharged by the test leak source 109 during a test and the potential of the contact 109a is reduced in a shorter period than a refresh period (e.g., 400 us).

For example, the test leak source 109 reduces the potential of the wire 112 to level L1 at which leakage caused by the switch circuit 110 is absent in the refresh period (400 us) and then a test is conducted on a reading operation, thereby reducing a test time. In this case, when the elements of the switch circuit 110 do not have any defects, the potential of the wire 112 does not decrease below the level L1. Thus when the potential of the wire 112 is lower than the level L1, it is decided that an element of the switch circuit 110 is defective.

As described above, the semiconductor memory of the present embodiment can check the presence or absence of leakage current, which is caused by the switch circuit on the wire, in a shorter time.

[Application]

The following will describe an example in which the semiconductor memory (NOR flash memory) 100 having the foregoing configuration and functions is mounted in a semiconductor chip. The same explanation is applicable to the semiconductor memories 100 described in the foregoing embodiments.

Figure 7:
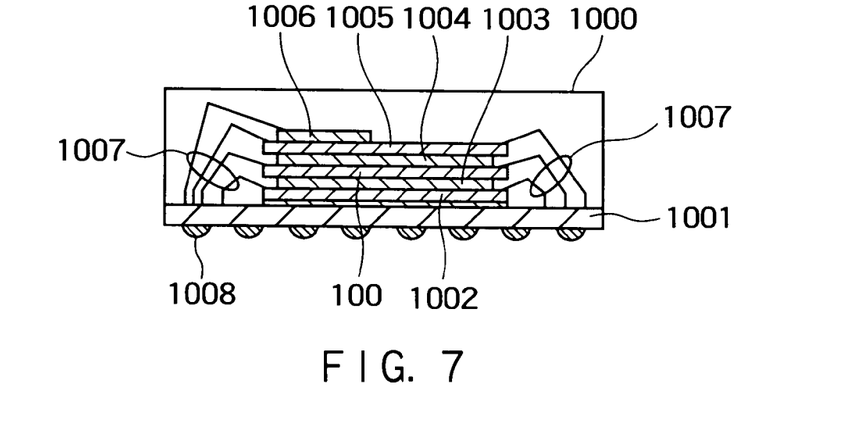
FIG. 7 is a sectional view showing an example of a semiconductor chip (Multi Chip Package (MCP)) 1000 including the semiconductor memory according to the first embodiment which is an aspect of the present invention, for example, the NOR flash memory 100.

FIG. 7 is a sectional view showing an example of a semiconductor chip (Multi Chip Package (MCP)) 1000 including the semiconductor memory according to the first embodiment which is an aspect of the present invention, for example, the NOR flash memory 100.

As shown in FIG. 7, the semiconductor chip 1000 includes, in the same package, a NAND flash memory 1002, a spacer 1003, the NOR flash memory 100, a spacer 1004, a pseudo static random access memory (PSRAM) 1005, and a controller 1006 which are sequentially stacked on a substrate 1001.

The NAND flash memory 1002 has, for example, a plurality of memory cells capable of storing multivalued data. The semiconductor chip 1000 may include a synchronous dynamic random access memory (SDRAM) instead of the PSRAM.

Of these memories, the NAND flash memory 1002 is used as, for example, a data storing memory according to a use of a memory system. The NOR flash memory 100 is used as, for example, a program storing memory. The PSRAM 1005 is used as, for example, a work memory.

The controller 1006 mainly controls the input and output of data and manages data for the NAND flash memory 1002. The controller 1006 has an ECC correcting circuit (not shown) which adds an error correction code (ECC) when data is written, and analyzes and processes the error correction code during reading.

The NAND flash memory 1002, the NOR flash memory 100, PSRAM 1005, and the controller 1006 are bonded to the substrate 1001 with wires 107.

Solder balls 1008 provided on the underside of the substrate 1001 are electrically connected to the wires 1007. As a package shape, for example, a surface-mounting ball grid array (BGA) is used which is a two-dimensional arrangement of the solder balls 1008.

Figure 8:
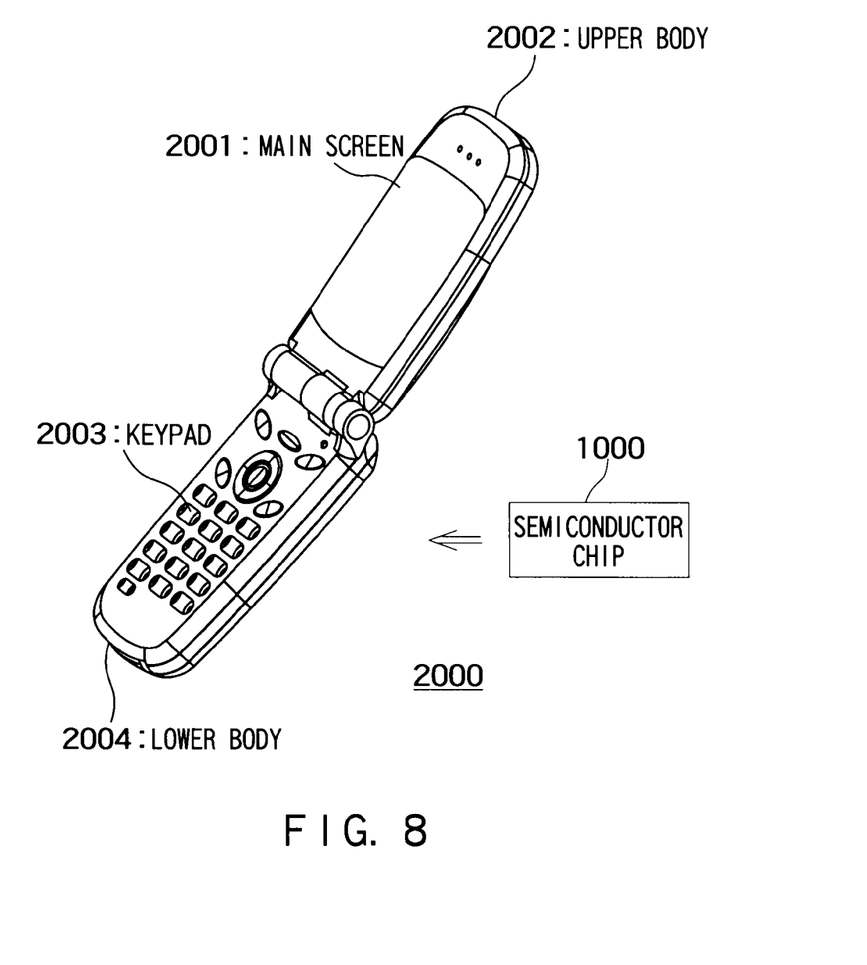
FIG. 8 shows the mobile phone having the semiconductor chip 1000 mounted therein.

The following will describe the case where the semiconductor chip 100 is applied to a mobile phone which is an example of electronic equipment.

FIG. 8 shows the mobile phone having the semiconductor chip 1000 mounted therein. As shown in FIG. 8, a mobile phone 2000 includes an upper body 2002 having a main screen 2001 and a lower body 2004 having key pads 2003. The semiconductor chip 1000 is mounted in the mobile phone 2000.

A CPU (not shown) mounted in the mobile phone 2000 accesses the semiconductor chip 1000 via an interface (not shown) and transfers data and so on. For example, the mobile phone 2000 uses the NAND flash memory 1002 as a storage region of user data and the NOR flash memory 100 as a program storage region of firmware and so on.

In such a memory system, the NOR flash memory 100 is demanded of a shorter reading time of data. Further, the amount of program data to be stored has increased with the functionality of application software.

The NOR flash memory 100 of the first embodiment which is an aspect of the present invention includes a memory cell capable of holding multivalued data, and is configured to quickly raise a reference current, thereby solving the foregoing problem.

The semiconductor chip 1000 is applicable to electronic equipment such as a personal computer, a digital still camera, and a PDA as well as the above mobile phone.

What is claimed is:

1. A semiconductor memory capable of storing and reading data in a memory cell for holding the data corresponding to a threshold voltage, comprising a reference current generating circuit having a reference current generating section and an amplifier section,
    the reference current generating section comprising:
    a first MOS transistor of a first conductivity type which has one end connected to a power supply and is diode-connected;
    a reference cell which is connected to an other end of the first MOS transistor and a ground potential, has a word line fed with a predetermined voltage, and is similarly configured as the memory cell;
    a second MOS transistor of the first conductivity type which has one end connected to the power supply and is fed with a current obtained by current mirroring a current passing through the first MOS transistor; and
    a third MOS transistor of a second conductivity type which is connected between an other end of the second MOS transistor and the ground potential and has a gate connected to the other end of the second MOS transistor,
    the amplifier section comprising:
    a fourth MOS transistor of the first conductivity type which has one end connected to the power supply and is diode-connected;
    a fifth MOS transistor of the second conductivity type which is connected between an other end of the fourth MOS transistor and the ground potential and has a gate connected to an output terminal;
    a sixth MOS transistor of the first conductivity type which has one end connected to the power supply and is fed with a current obtained by current mirroring a current passing through the fourth MOS transistor;
    a seventh MOS transistor of the second conductivity type which is connected between an other end of the sixth MOS transistor and the ground potential and has a gate connected to the gate of the third MOS transistor;
    an eighth MOS transistor of the first conductivity type which has one end connected to the power supply and is fed with a current obtained by current mirroring the current passing through the fourth MOS transistor;
    a ninth MOS transistor of the second conductivity type which is connected between an other end of the eighth MOS transistor and the ground potential and has a gate connected to the other end of the eighth MOS transistor;
    a tenth MOS transistor of the first conductivity type which has one end connected to the power supply, an other end connected to the output terminal, and a gate connected to the other end of the sixth MOS transistor; and
    an eleventh MOS transistor of the second conductivity type which is connected between the other end of the tenth MOS transistor and the ground potential and has a gate connected to the other end of the eighth MOS transistor,
    the amplifier section outputting a reference current from the output terminal to a wire in response to an output of the reference current generating section.

2. The semiconductor memory according to claim 1, further comprising a switch circuit connected between the wire and the output terminal,
    wherein after the wire is charged by supplying the reference current from the output terminal to the wire, the wire and the output terminal are disconnected from each other by turning off the switch circuit.

3. The semiconductor memory according to claim 2, further comprising the switch circuit connected between the wire and the output terminal,
    wherein after the wire and the output terminal are disconnected from each other by turning off the switch circuit, the wire is charged by turning on the switch circuit every predetermined period and supplying the reference current from the output terminal to the wire.

4. The semiconductor memory according to claim 3, wherein the tenth MOS transistor is larger in size than the first, second, fourth, sixth, and eighth MOS transistors, and
    the eleventh MOS transistor is larger in size than the third, fifth, seventh, and ninth MOS transistors.

5. The semiconductor memory according to claim 3, wherein the semiconductor memory is a NOR flash memory.

6. The semiconductor memory according to claim 2, wherein after the semiconductor memory is powered up, a first reading operation is performed in a state in which the switch circuit is turned off.

7. The semiconductor memory according to claim 6, wherein the tenth MOS transistor is larger in size than the first, second, fourth, sixth, and eighth MOS transistors, and
    the eleventh MOS transistor is larger in size than the third, fifth, seventh, and ninth MOS transistors.

8. The semiconductor memory according to claim 6, wherein the semiconductor memory is a NOR flash memory.

9. The semiconductor memory according to claim 2, wherein the tenth MOS transistor is larger in size than the first, second, fourth, sixth, and eighth MOS transistors, and
    the eleventh MOS transistor is larger in size than the third, fifth, seventh, and ninth MOS transistors.

10. The semiconductor memory according to claim 2, wherein the semiconductor memory is a NOR flash memory.

11. The semiconductor memory according to claim 1, further comprising a switch circuit connected between the wire and the output terminal, wherein after the wire and the output terminal are disconnected from each other by turning off the switch circuit, the wire is charged by turning on the switch circuit every predetermined period and supplying the reference current from the output terminal to the wire.

12. The semiconductor memory according to claim 11, wherein the tenth MOS transistor is larger in size than the first, second, fourth, sixth, and eighth MOS transistors, and the eleventh MOS transistor is larger in size than the third, fifth, seventh, and ninth MOS transistors.

13. The semiconductor memory according to claim 11, wherein the semiconductor memory is a NOR flash memory.

14. The semiconductor memory according to claim 1, wherein the tenth MOS transistor is larger in size than the first, second, fourth, sixth, and eighth MOS transistors, and the eleventh MOS transistor is larger in size than the third, fifth, seventh, and ninth MOS transistors.

15. The semiconductor memory according to claim 14, wherein the semiconductor memory is a NOR flash memory.

16. The semiconductor memory according to claim 1, wherein the semiconductor memory is a NOR flash memory.

* * * * *